United States Patent
Gelencser et al.

(10) Patent No.: US 7,200,056 B2
(45) Date of Patent: Apr. 3, 2007

(54) MEMORY ROW/COLUMN REPLACEMENT IN AN INTEGRATED CIRCUIT

(75) Inventors: Paul M. Gelencser, Austin, TX (US); Jose Antonio Lyon, IV, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 177 days.

(21) Appl. No.: 10/889,159

(22) Filed: Jul. 12, 2004

(65) Prior Publication Data

US 2006/0007763 A1    Jan. 12, 2006

(51) Int. Cl.
G11C 29/00   (2006.01)
G11C 7/00    (2006.01)
G06F 11/00   (2006.01)

(52) U.S. Cl. .................. 365/200; 714/710; 714/711; 714/42; 714/723

(58) Field of Classification Search ............... 365/200; 714/710, 711, 42, 723, 6
See application file for complete search history.

(56) References Cited

U.S. PATENT DOCUMENTS 6,421,286 B1    7/2002  Ohtani et al.
2004/0163015 A1* 8/2004  Nadeau-Dostie et al. ..... 714/42

OTHER PUBLICATIONS

Shoukourian et al., "An Approach for Evaluation of Redundancy Analysis Algorithms," vol. 0-7695-1242-9/01, IEEE 2001, pp. 51-54.
Kawagoe et al., A Built-In Self Repair Analyzer (CRESTA) for Embedded DRAM, Proc. IEEE Int. Test Conference, ITC 2000, pp. 567-574.

* cited by examiner

Primary Examiner—Amir Zarabian
Assistant Examiner—Michael Weinberg
(74) Attorney, Agent, or Firm—Susan C. Hill; David G. Dolezal (57) ABSTRACT

An automated process for designing a memory having row/column replacement is provided. In one embodiment, a potential solution array (50) is used in conjunction with the row/column locations of memory cell failures to determine values stored in the actual solution storage circuitry (92). A selected one of these vectors stored in the actual solution storage circuitry (92) is then used to determine rows and columns in memory array (20) to be replaced with redundant rows (22, 24) and redundant columns (26).

31 Claims, 5 Drawing Sheets

MEMORY ROW/COLUMN REPLACEMENT IN AN INTEGRATED CIRCUIT

FIELD OF THE INVENTION

The present invention relates generally to integrated circuits having a memory, and more particularly to memory row/column replacement in an integrated circuit.

RELATED ART

It is very desirable for integrated circuit designers to automate the process of designing a memory as much as possible. Many memories implemented on integrated circuits use one or more redundant rows and/or one or more redundant columns to replace rows and columns that are found to have one or more defective memory cells. An automated approach was needed that would allow automated tools to be used in determining which rows/columns in an integrated circuit memory should be replaced and then performing the replacement.

BRIEF DESCRIPTION OF THE DRAWINGS

The present invention is illustrated by way of example and is not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

As used herein, the term "bus" is used to refer to a plurality of signals or conductors which may be used to transfer one or more various types of information, such as data, addresses, control, or status. Brackets are used to indicate the conductors of a bus or the bit locations of a value. For example, "bus 60 [7-0]" or "conductors [7-0] of bus 60" indicates the eight lower order conductors of bus 60, and "address bits [7-0]" or "ADDRESS [7-0]" indicates the eight lower order bits of an address value. The symbol "%" preceding a number indicates that the number is represented in its binary or base two form.

Figure 1:
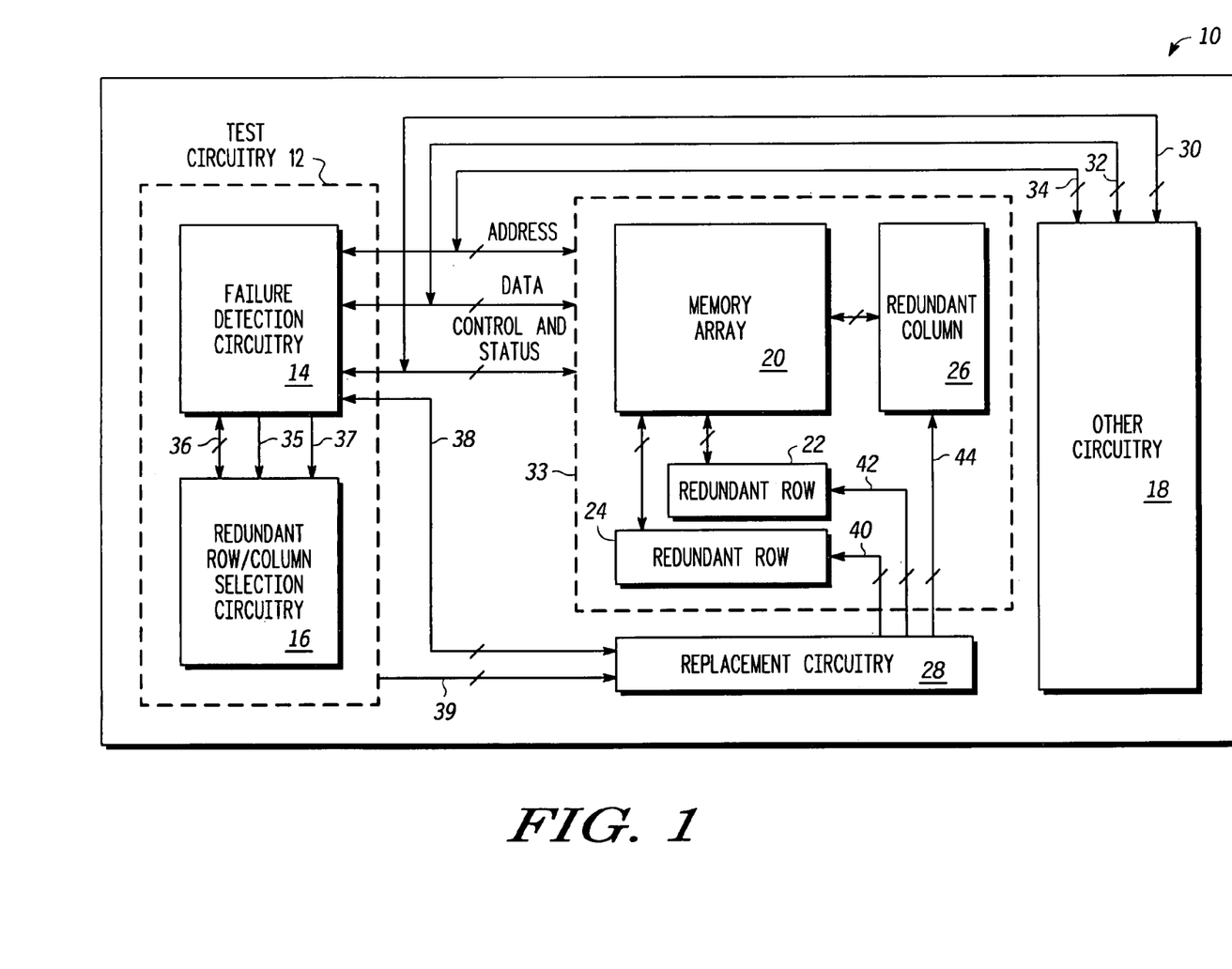
FIG. 1 illustrates, in block diagram form, an integrated circuit in accordance with one embodiment of the present invention.

FIG. 1 illustrates, in block diagram form, an integrated circuit 10 in accordance with one embodiment of the present invention. In the illustrated embodiment, integrated circuit 10 has test circuitry 12, memory 33, and other circuitry 18 which are bi-directionally coupled by way of address signals 34, data signals 32, and control and status signals 30. In one embodiment, memory 33 includes memory array 20, redundant row 22, redundant row 24, and redundant column 26. Memory array 20 is bi-directionally coupled to each of redundant rows 22, 24 and redundant column 26 so that a failed row in array 20 may be replaced by redundant row 22 or 24 and a failed column in array 20 may be replaced by redundant column 26. Alternate embodiments may use any number and arrangement of bits in memory array 20 and may use any number of redundant rows and redundant columns. Note that memory 33 can be any type of memory or storage circuitry which has redundancy. For example, a memory 20 may be used to implement a register bank, a buffer, a queue, and a wide variety of other functional blocks. The purposes for which memory 20 may be used are not limited in any way.

Replacement circuitry 28 is bi-directionally coupled to test circuitry 12 by signals 38. Replacement circuitry 28 is coupled to provide signals 40 to redundant row 24, to provide signals 42 to redundant row 22, and to provide signals 44 to redundant column 26. In some embodiments, signals 40, 42, and 44 may be used initiate or carry out the replacement of rows/columns in array 20 with available redundant rows/columns 22, 24, 26.

In one embodiment, test circuitry 12 includes failure detection circuitry 14 and redundant row/column selection circuitry 16 which are bi-directionally coupled by way of signals 36. In one embodiment, failure detection circuitry 14 is bi-directionally coupled to address signals 34, data signals 32, and control and status signals 30. In alternate embodiments, test circuitry 12 may include additional circuitry (not shown) which performs other test functions. Other circuitry 18 may be any type of circuitry: some possible examples are one or more processors, timers, communication interfaces, ports, analog to digital converters, digital to analog converters, drivers such as liquid crystal display drivers, or circuitry that performs any other desired function. Some embodiments may not include other circuitry 18. Also, any one or more portions of integrated circuit 10 may be implemented on a separate integrated circuit. As one example, integrated circuit 10 may include only memory 33 and the functionality of test circuitry 12 and replacement circuitry 28 may be performed outside of integrated circuit 10. In an alternate embodiment, integrated circuit 10 may include built-in-self-test (BIST) capabilities so that the entire process of detecting and replacing failed memory locations can be performed by integrated circuit 10 without any outside interaction required.

Figure 2:
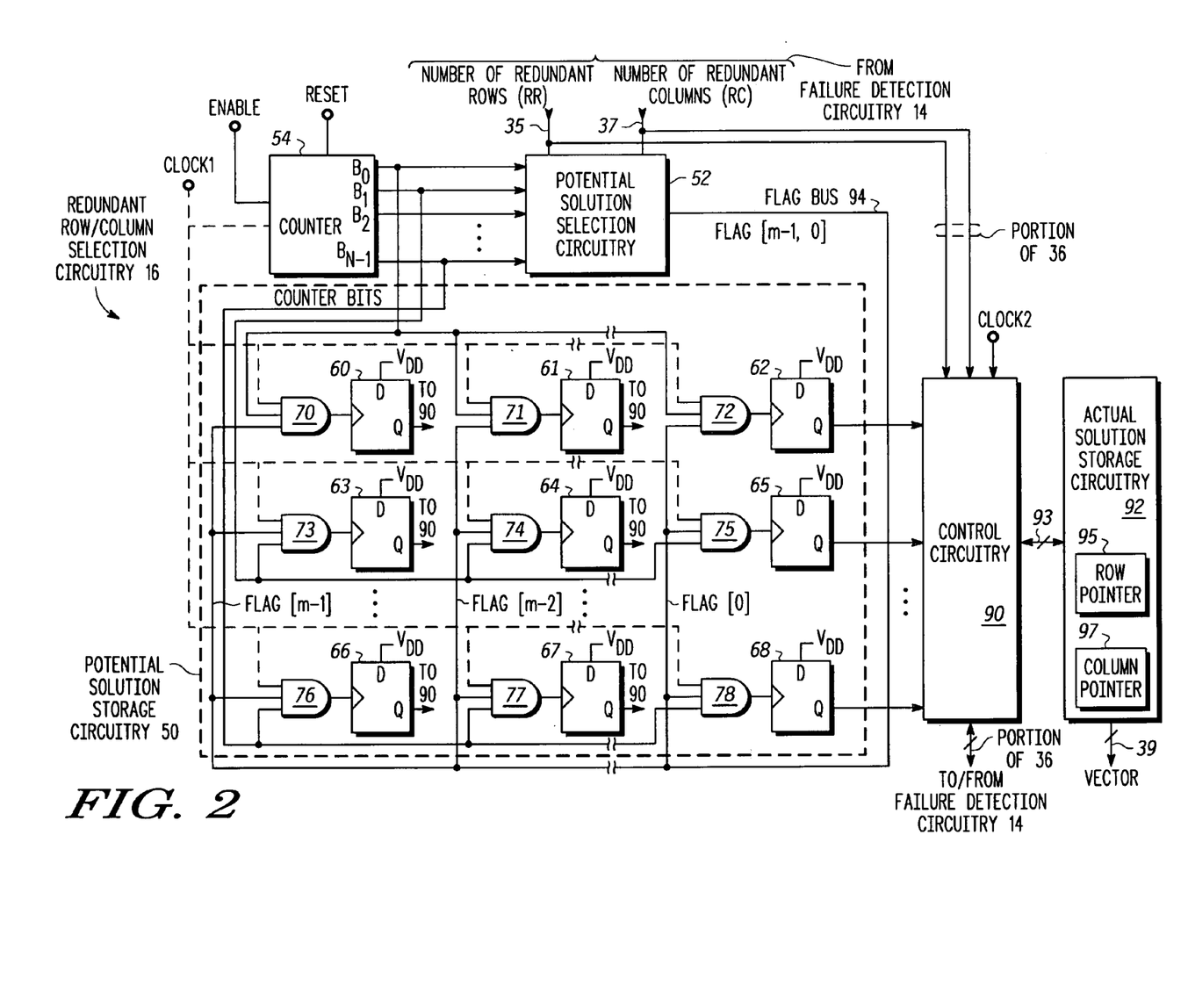
FIG. 2 illustrates, in partial block diagram form and partial schematic diagram form, redundant row/column selection circuitry 16 of FIG. 1, in accordance with one embodiment of the present invention.

FIG. 2 illustrates, in partial block diagram form and partial schematic diagram form, redundant row/column selection circuitry 16 of FIG. 1, in accordance with one embodiment of the present invention. In the illustrated embodiment, redundant row/column selection circuitry 16 includes counter 54 which provides a counter value to potential solution selection circuitry 52 and to potential solution storage circuitry 50. Counter 54 has a reset input to reset counter 54 and an enable input which may be used to selectively increment counter 54. Potential solution selection circuitry 52 also receives the number of redundant rows (RR) and the number of redundant columns (RC) as inputs from failure detection circuitry 14. In one embodiment, potential solution selection circuitry 52 uses RR, RC, and the number of bits in the current counter value that are "1" to determine whether or not to store that current counter value in potential solution storage circuitry 50.

Potential solution selection circuitry 52 generates a flag bus 94 having "m" bits labeled FLAG [m−1, 0] which are used as inputs to AND gates 70–78 to determine which of D flip-flops 60–68 store which bits of the counter value from counter 54. In one embodiment, the following equations are used by potential solutions selection circuitry 52 to generate flag bus 94.

In one embodiment, vectors are defined to specify the number of redundant rows as, $$RR==Rj,\ldots,R2,R1,R0$$

and the number of redundant columns as, $$RC==Ck,\ldots,C2,C1,C0.$$

Further, defining the counter output values to represents rows as Bi==1 and columns as Bi==0, the output bus 94 of the potential solution selection circuitry 52, flag[m−1:0], can be realized as follows. Note that the following calculations are row-centric due to the assignment of rows as Bi==1. The redundant column count value RC is used to determine the terminal count of the counter in order to stop and reset the counter, and is used to determine the number of bits the counter needs to have in order to represent the complete number of rows and columns. A similar column-centric result can be achieved by switching the assignments to represent columns as Bi==1.

In one embodiment, signals indicating the number of replacement rows are determined as follows:

$$R0=Rbj^* \ldots *Rb2*Rb1*Rb0. \text{(zero redundant rows)}$$

$$R1=Rbj^* \ldots *Rb2*Rb1*R0. \text{(one redundant row)}$$

$$R2=Rbj^* \ldots *Rb2*R1*Rb0. \text{(two redundant rows)}$$

$$\ldots$$

$$Rn=Rj^* \ldots *R2*R1*R0. (\text{'n' redundant rows})$$

(where 'R' represents a bit of vector RR, and Rb represents an inverted bit of RR).

Note that the number of row and column repair elements can be represented on vectors RR and RC in any appropriate manner, such as, for example, either encoded or one-hot (i.e. only one bit in a vector is asserted). This would change the equations above, but not result in a materially different method.

In one embodiment, signals identifying counter values containing 3 high bits are determined as follows:

$$B3a=bbn-1^* \ldots *bb3*b2*b1*b0$$

$$B3b=bbn-1^* \ldots *b3*bb2*b1*b0$$

$$B3c=bbn-1^* \ldots *b3*b2*bb1*b0$$

$$\ldots$$

$$B3x=bn-1*bn-2*bn-3 \ldots *bb3*bb2*bb1*bb0$$

(where 'b' represents a bit, 'bb' represents an inverted bit, and 'x' refers to the m-th bit of the vector).

In one embodiment, signals identifying counter values containing 2 high bits are determined as follows:

$$B2a=bbn-1^* \ldots *bb3*bb2*b1*b0$$

$$B2b=bbn-1^* \ldots *bb3*b2*bb1*b0$$

$$B2c=bbn-1^* \ldots *bb3*b2*b1*bb0$$

$$\ldots$$

$$B2x=bn-1*bn-2 \ldots *bb3*bb2*bb1*bb0$$

(where 'b' represents a bit, 'bb' represents an inverted bit, and 'x' refers to the m-th bit of the vector).

Signals identifying other cases of high/true counter bits may be generated in a similar way.

In one embodiment, the output bus 94 from the potential solution selection circuitry 52, flag[m−1:0], may be generated as follows.

$$\text{flag}[m-1]=(R0*B0)+(R1*B1a)+\ldots+(Rn*Bn)$$
[Note: the counter only has one state each for all '1' (Bn) and all '0' (B0).]

$$\text{flag}[m-2]=(R0*0)+(R1*B1b)+(R2*B2b)+(R3*B3b)+(Rn*0)$$

$$\text{flag}[m-3]=(R0*0)+(R1*B1c)+(R2*B2c)+(R3*B3c)+(Rn*0)$$

$$\text{flag}[m-4]=(R0*0)+(R1*B1d)+(R2*B2d)+(R3*B3d)+(Rn*0)$$

$$\ldots$$

$$\text{flag}[0]=(R0*0)+(R1*B1x)+(R2*B2x)+(R3*B3x)\ldots+(Rn*0)$$

Alternate embodiments may generate bus 94 in a different manner.

Note that the height and width of the array of AND gates and D flip-flops used in potential solution storage circuitry 50 is variable for different embodiments of integrated circuit 10. Block 406 in FIG. 4 describes one way to determine the array dimensions, and thus the number of AND gates and D flip-flops, used in potential solution storage circuitry 50. Alternate embodiments may use different approaches. The "N by m" array for potential solution storage circuitry 50 represents all possible array sizes. Alternate embodiments may use any desired array size for potential solution storage circuitry 50.

Control circuitry 90 receives the potential solution values from potential solution storage circuitry 50 and receives row and column information for failed memory cells from failure detection circuitry 14. Control circuitry 90 also receives the number of redundant rows (RR) by way of signal 35 and the number of redundant columns (RC) by way of signal 37 as inputs. Control circuit 90 uses this information to determine which indications of the locations of memory array failures are stored in the actual solution storage circuitry 92 and where this location information is stored within the actual solution storage circuitry 92 (see blocks 410 and 411 of FIG. 4).

Actual solution storage circuitry 92 is bi-directionally coupled to control circuitry 90 by way of signals 93. In one embodiments, vector 39 may be used by replacement circuitry 28 (see FIG. 1) to select which one or more rows and/or columns in memory array 20 will be replaced by one or more redundant row 22, 24 and/or redundant columns 26. In one embodiment, actual solution storage circuitry 92 includes row pointer 95 and column pointer 97. In an alternate embodiment, the control for incrementing and/or decrementing pointers 95 and 97 may be implemented in control circuitry 90. Alternate embodiments may locate and implement pointers 95 and 97 in different ways. The operation of row pointer 95 and column pointer 97 for the illustrated embodiment will be described in FIG. 3 below.

Note that in the embodiment illustrated in FIG. 2, counter 54 and AND gates 70–78 receive a clock signal CLOCK1 as an input. Also, control circuitry 90 receives a clock signal CLOCK2 as an input. Alternate embodiments may use clocked or non-clocked circuitry for various portion of redundant row/column selection circuitry 16.

Although the embodiment illustrated in FIG. 2 uses an up counter for counter 54, alternate embodiments may use a down counter instead. Note also that counter 54 may alternately be implemented using an encoder. The encoded values output from the encoder may then be selected in whatever order is desired, unlike the counter 54 which will present values in either ascending order (up counter) or descending order (down counter). In yet other alternate embodiments, any circuitry may be used in place of counter 54 to provide the desired values from which to choose the potential solution values (see steps 409 and 410 in FIG. 4).

In one embodiment, each D flip-flop 60–68 has a reset input and can thus be reset when the reset input is asserted. In alternate embodiments, all or any portion of the illustrated circuitry may have a reset input that allows the circuitry to be reset to a predetermined value when one or more reset signals are asserted.

Figure 3:
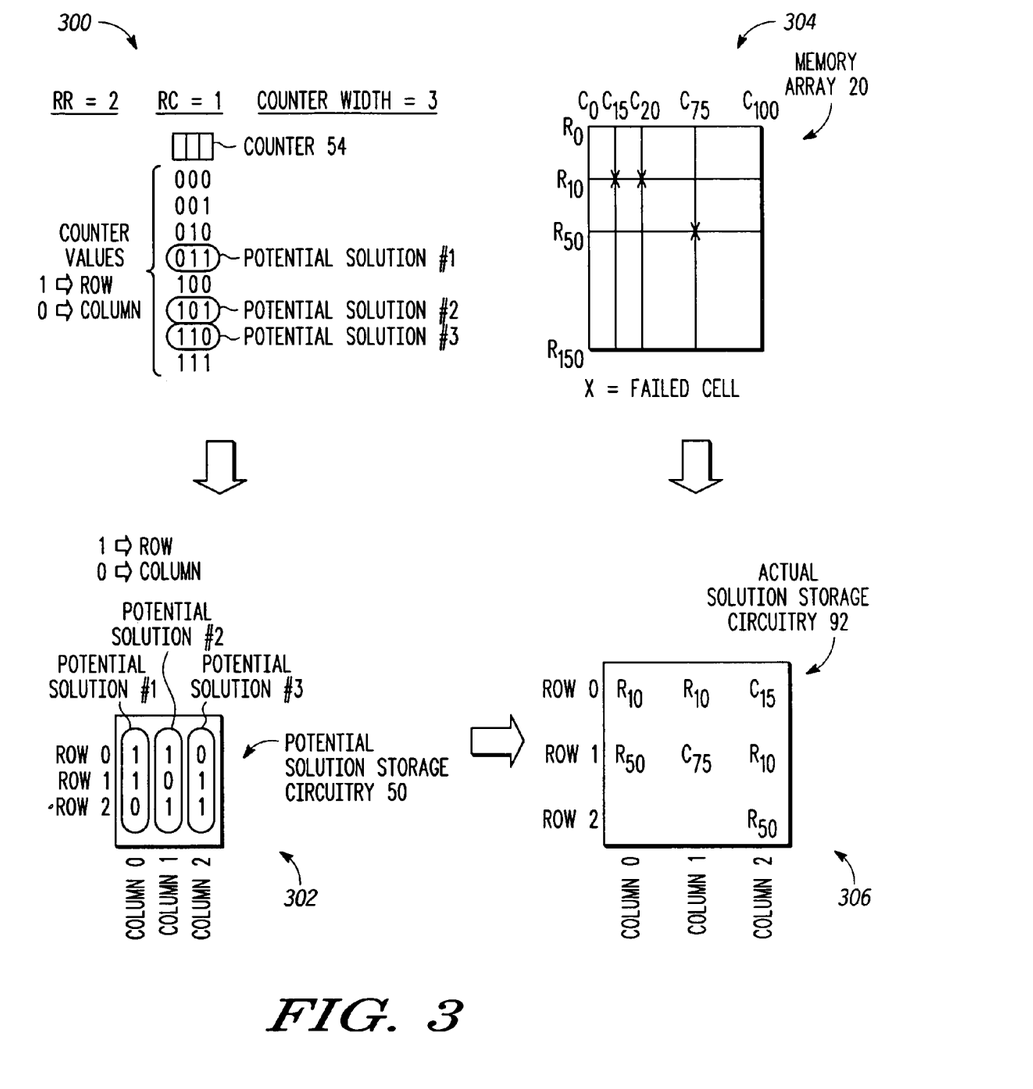
FIG. 3 illustrates, in block diagram form, an example of how potential solution values are generated and stored and how actual solution values are verified and stored.

FIG. 3 illustrates one possible example of how potential solution values are generated and stored and how actual solution values are generated and stored using the present invention. Note that for the illustrated example, the number of redundant rows (RR) is 2 and the number of redundant columns (RC) is 1, and for the 'B' vector generated by the counter, rows are assigned to be '1' and columns are assigned to be '0'. Thus, referring to quadrants 300 and 302, the width of counter 54 is determined to be equal to 3 (i.e. the number of redundant rows 2 plus the number of redundant columns 1). Counter 54 is initially set to a predetermined binary value, by coming out of reset to a predetermined binary value or by being loaded with a predetermined binary value. This predetermined binary value is the first binary value that is generated and checked to see if it is a potential solution value. This is done by counting the number of ones in the first binary value. This first binary value is a potential solution value if the number of ones in the first binary value is equal to the number of redundant rows. If the number of ones in the first binary value is equal to the number of redundant rows, then the first binary value is selected as a potential solution value and is stored in the first column of the potential solution storage circuitry 50. For the illustrated example, the first binary value %000 does not contain 2 ones, so it is not stored in the first column of the potential solution storage circuitry 50.

Counter 54 is then incremented by one and now provides a second binary value %001. This second binary value is a potential solution value if the number of ones in the second binary value is equal to the number of redundant rows. If the number of ones in the second binary value is equal to the number of redundant rows, then the second binary value is selected as a potential solution value and is stored in the next available column of the potential solution storage circuitry 50. For the illustrated example, the second binary value %001 does not contain 2 ones, so it is not stored in the first column of the potential solution storage circuitry 50.

Counter 54 is again incremented by one and now stores a third binary value %010. This third binary value is a potential solution value if the number of ones in the third binary value is equal to the number of redundant rows. If the number of ones in the third binary value is equal to the number of redundant rows, then the third binary value is selected as a potential solution value and is stored in the next available column of the potential solution storage circuitry 50. For the illustrated example, the third binary value %010 does not contain 2 ones, so it is not stored in the first column of the potential solution storage circuitry 50.

Counter 54 is again incremented by one and now stores a fourth binary value %011. This fourth binary value is a potential solution value if the number of ones in the fourth binary value is equal to the number of redundant rows. If the number of ones in the fourth binary value is equal to the number of redundant rows, then the fourth binary value is selected as a potential solution value and is stored in the next available column of the potential solution storage circuitry 50. For the illustrated example, the fourth binary value %011 does indeed contain 2 ones, so it is stored in the first column of the potential solution storage circuitry 50 as illustrated by the column labeled potential solution #1.

Counter 54 is again incremented by one and now stores a fifth binary value %100. This fifth binary value is a potential solution value if the number of ones in the fifth binary value is equal to the number of redundant rows. If the number of ones in the fifth binary value is equal to the number of redundant rows, then the fifth binary value is selected as a potential solution value and is stored in the next available column of the potential solution storage circuitry 50. For the illustrated example, the fifth binary value %100 does not contain 2 ones, so it is not stored in the second column of the potential solution storage circuitry 50.

Counter 54 is again incremented by one and now stores a sixth binary value %101. This sixth binary value is a potential solution value if the number of ones in the sixth binary value is equal to the number of redundant rows. If the number of ones in the sixth binary value is equal to the number of redundant rows, then the sixth binary value is selected as a potential solution value and is stored in the next available column of the potential solution storage circuitry 50. For the illustrated example, the sixth binary value %101 does indeed contain 2 ones, so it is stored in the second column of the potential solution storage circuitry 50 as illustrated by the column labeled potential solution #2.

Counter 54 is again incremented by one and now stores a seventh binary value %110. This seventh binary value is a potential solution value if the number of ones in the seventh binary value is equal to the number of redundant rows. If the number of ones in the seventh binary value is equal to the number of redundant rows, then the seventh binary value is selected as a potential solution value and is stored in the next available column of the potential solution storage circuitry 50. For the illustrated example, the seventh binary value %110 does indeed contain 2 ones, so it is stored in the third column of the potential solution storage circuitry 50 as illustrated by the column labeled potential solution #3.

Counter 54 is again incremented by one and now stores an eighth binary value %111. This eighth binary value is a potential solution value if the number of ones in the eighth binary value is equal to the number of redundant rows. If the number of ones in the eighth binary value is equal to the number of redundant rows, then the eighth binary value is selected as a potential solution value and is stored in the next available column of the potential solution storage circuitry 50. For the illustrated example, the eighth binary value %111 does not contain 2 ones, so it is not stored in the next available column of the potential solution storage circuitry 50.

Once all of the counter values have been examined, then potential storage circuitry 50 stores all of the potential solutions. Note that there are a variety of ways to determine when all of the counter values have been examined. In one embodiment, the rollover of counter 54 may be used to determine when all of the counter values have been examined. In an alternate embodiment, a comparator may be used to compare the counter 54 value to a predetermined constant value to determine when all of the counter values have been examined Referring to quadrant 304, memory array 20 is one possible embodiment of a memory array having 151 rows (row 0 to row 150) and 101 columns (column 0 to column 100). The "x"s indicate the locations of the failed memory cells as determined by failure detection circuitry 14 (see FIG. 1). These failed memory cell locations can be handled one at time as they are detected, or alternately these failed memory cell locations can be stored as coordinates and handled at some time in the future prior to replacement. In the illustrated example, 3 failures have been detected: the first failure at row 10/column 15; the second failure at row 10/column 20; and the third failure at row 50/column 75.

Referring to quadrant 306, each entry in actual solution storage circuitry 92 has an address field and a full bit. The full bit indicates whether or not the address field stores an address of a failed memory cell. Actual solution storage circuitry 92 also has a row pointer 95 and a column pointer 97. Once a failed memory cell has been located, the potential solution values stored in potential solution storage circuitry 50 (see quadrant 302) are used in conjunction with the column location and row location of the failed memory cell to determine whether the row location or column location values are stored in the actual solution storage circuitry 92. Referring to actual solution storage circuitry 92, the row pointer is incremented before a storage occurs if the current full bit is asserted and the new failing address is not identical to the address stored in the actual solution storage circuitry. The column pointer is incremented if any one of the following conditions are met: (1) if a failed location has just been stored in actual solution storage circuitry 92; or (2) if the current full bit is asserted and the new failing address is identical to the address stored in the actual solution storage circuitry; or (3) if there are no more available storage locations within the current column. Note that for the illustrated embodiment, both the row pointer and the column pointer are reset to 0 after the storage of defect information in actual solution storage circuitry 92 has been completed for each defect.

FIRST DEFECT IN MEMORY ARRAY 20

In the illustrated example, assume that the memory cell located at row 10/column 15 has been detected as the first failure. The row pointer and column pointer of actual solution storage circuitry 92 initially point to row 0/column 0. The full bit of row 0/column 0 indicates that row 0/column 0 is not full. The value stored in row 0/column 0 of potential solution storage circuitry 50 is a %1, which has been defined as "row". This "row" indication is used to determine that a row address (R10) of the new failure is stored in actual solution storage circuitry 92 at the location indicated by the row pointer and column pointer of actual solution storage circuitry 92 (row 0/column 0). The row address "R10" is stored in row 0/column 0 of actual solution storage circuitry 92. The column pointer is incremented after the storage of R10 because a failed location has just been stored in actual solution storage circuitry 92. The pointer now points to row 0/column 1.

The value stored in row 0/column 1 of potential solution storage circuitry 50 is a %1, which has been defined as "row". This "row" indication is used to determine that a row address (R10) of the new failure is stored in actual solution storage circuitry 92 at the location indicated by the row pointer and column pointer of actual solution storage circuitry 92 (row 0/column 1). The row address "R10" is stored in row 0/column 1 of actual solution storage circuitry 92. The column pointer is incremented after the storage of R10 because a failed location has just been stored in actual solution storage circuitry 92. The pointer now points to row 0/column 2.

The value stored in row 0/column 2 of potential solution storage circuitry 50 is a %0, which has been defined as "column". This "column" indication is used to determine that a column address (C15) of the new failure is stored in actual solution storage circuitry 92 at the location indicated by the row pointer and column pointer of actual solution storage circuitry 92 (row 0/column 2). The column address "C15" is stored in row 0/column 2 of actual solution storage circuitry 92. The column pointer is incremented after the storage of C15 because a failed location has just been stored in actual solution storage circuitry 92. The row pointer and column pointer are both reset to 0. Note that the first failure has been stored by storing R10, R10, and C15 in the first row of actual solution storage circuitry 92.

SECOND DEFECT IN MEMORY ARRAY 20

In the illustrated example, assume that the memory cell located at row 10/column 20 has been detected as the second failure. The row pointer and column pointer of actual solution storage circuitry 92 currently point to row 0/column 0. The full bit of row 0/column 0 indicates that row 0/column 0 is full. The value stored in row 0/column 0 of potential solution storage circuitry 50 is %1, which has been defined as "row" type. However, the current failing row address is identical to the address stored in row 0/column 0 of the actual solution storage circuitry 92; thus the row pointer is not incremented. The column pointer is incremented because the current full bit is asserted and the new failing row address is identical to the row address stored in the actual solution storage circuitry. The pointer now points to row 0/column 1.

The value stored in row 0/column 1 of potential solution storage circuitry 50 is a %1, which has been defined as "row". This "row" indication is used to determine that a row address (R10), not a column address (C20), of the new failure may be stored in actual solution storage circuitry 92 at the location indicated by the row pointer and column pointer (row 0/column 1). However, R10 is already stored in row 0/column 1 of actual solution storage circuitry 92 due to the first failure. The column pointer is incremented because the current full bit is asserted and the new failing row address is identical to the row address stored in the actual solution storage circuitry. The pointer now points to row 0/column 2.

The value stored in row 0/column 2 of potential solution storage circuitry 50 is a %0, which has been defined as "column". This "column" indication is used to determine that a column address (C20) of the new failure may be stored in actual solution storage circuitry 92 at the location indicated by the row pointer and column pointer (row 0/column 2). The column address "C15" is already stored in row 0/column 2 of actual solution storage circuitry 92. The row pointer is incremented because the current full bit is asserted and the current failing column address is not identical to the address stored in the actual solution storage circuitry. The pointer now points to row 1/column 2.

The value stored in row 1/column 2 of potential solution storage circuitry 50 is a %1, which has been defined as "row". This "row" indication is used to determine that a row address (R10), not a column address (C20), of the most recent failure may be stored in actual solution storage circuitry 92 at the location indicated by the row pointer and column pointer (row 1/column 2). Because the full bit is not asserted (i.e. row 1, column 2 of the actual solution storage circuitry 92 is empty), the row address (R10) of the new failure is stored in actual solution storage circuitry 92 at the location indicated by the row pointer and column pointer (row 1/column 2). The row pointer and the column pointer are reset to 0 between defects.

THIRD DEFECT IN MEMORY ARRAY 20

In the illustrated example, assume that the memory cell located at row 50/column 75 has been detected as the third failure. The row pointer and column pointer of actual solution storage circuitry 92 initially point to row 0/column 0. The full bit of row 0/column 0 indicates that row 0/column 0 is full. The value stored in row 0/column 0 of potential solution storage circuitry 50 is a %1, which has been defined as "row". This "row" indication is used to determine that a row address (R50) of the new failure may be stored in actual solution storage circuitry 92 at the location indicated by the row pointer and column pointer (row 0/column 0). The row address "R10" is already stored in row 0/column 0 of actual solution storage circuitry 92. The row pointer is incremented because the current full bit is asserted and the current failing row address is not identical to the row address stored in the actual solution storage circuitry. The pointer now points to row 1/column 0.

The value stored in row 1/column 0 of potential solution storage circuitry 50 is a %1, which has been defined as "row". This "row" indication is used to determine that a row address (R50) of the new failure is stored in actual solution storage circuitry 92 at the empty location indicated by the row pointer and column pointer of actual solution storage circuitry 92 (row 1/column 0). The row address "R50" is stored in row 1/column 0 of actual solution storage circuitry 92. The column pointer is incremented after the storage of R50 because a failed location has just been stored in actual solution storage circuitry 92. The pointer now points to row 0/column 1.

The value stored in row 0/column 1 of potential solution storage circuitry 50 is a %1, which has been defined as "row". This "row" indication is used to determine that a row address (R50) of the new failure may be stored in actual solution storage circuitry 92 at the location indicated by the row pointer and column pointer of actual solution storage circuitry 92 (row 0/column 1). The row address "R20" is already stored in row 0/column 1 of actual solution storage circuitry 92. The row pointer is incremented before storage because the current full bit is asserted and the new failing row address (R50) is not identical to the row address (R10) stored in the actual solution storage circuitry. The pointer now points to row 1/column 1.

The value stored in row 1/column 1 of potential solution storage circuitry 50 is a %0, which has been defined as "column". This "column" indication is used to determine that a column address (C75) of the new failure is stored in actual solution storage circuitry 92 at the location indicated by the row pointer and column pointer of actual solution storage circuitry 92 (row 1/column 1). The column address "C75" is stored in row 1/column 1 of actual solution storage circuitry 92. The column pointer is incremented after the storage of C75 because a failed location has just been stored in actual solution storage circuitry 92. The pointer now points to row 0/column 2.

The value stored in row 0/column 2 of potential solution storage circuitry 50 is a %0, which has been defined as "column". This "column" indication is used to determine that a column address (C75) of the new failure may be stored in actual solution storage circuitry 92 at the location indicated by the row pointer and column pointer of actual solution storage circuitry 92 (row 0/column 2). The column address "C15" is already stored in row 0/column 2 of actual solution storage circuitry 92. The row pointer is incremented before storage because the current full bit is asserted and the current failing column address is not identical to the column address stored in the actual solution storage circuitry. The pointer now points to row 1/column 2.

The value stored in row 1/column 2 of potential solution storage circuitry 50 is a %1, which has been defined as "row". This "row" indication is used to determine that a row address (R50) of the new failure may be stored in actual solution storage circuitry 92 at the location indicated by the row pointer and column pointer of actual solution storage circuitry 92 (row 1/column 2). The row address "R10" is already stored in row 1/column 2 of actual solution storage circuitry 92. The row pointer is incremented before storage because the current full bit is asserted and the current failing row address is not identical to the row address stored in the actual solution storage circuitry. The pointer now points to row 2/column 2.

The value stored in row 2/column 2 of potential solution storage circuitry 50 is a %1, which has been defined as "row". This "row" indication is used to determine that a row address (R50) of the new failure is stored in actual solution storage circuitry 92 at the empty location indicated by the row pointer and column pointer of actual solution storage circuitry 92 (row 2/column 2). The row address "R50" is stored in row 2/column 2 of actual solution storage circuitry 92. The row pointer and the column pointer are reset to 0 after the storage of failure row and column for each defect in actual solution storage circuitry 92 has been completed.

Figure 4:
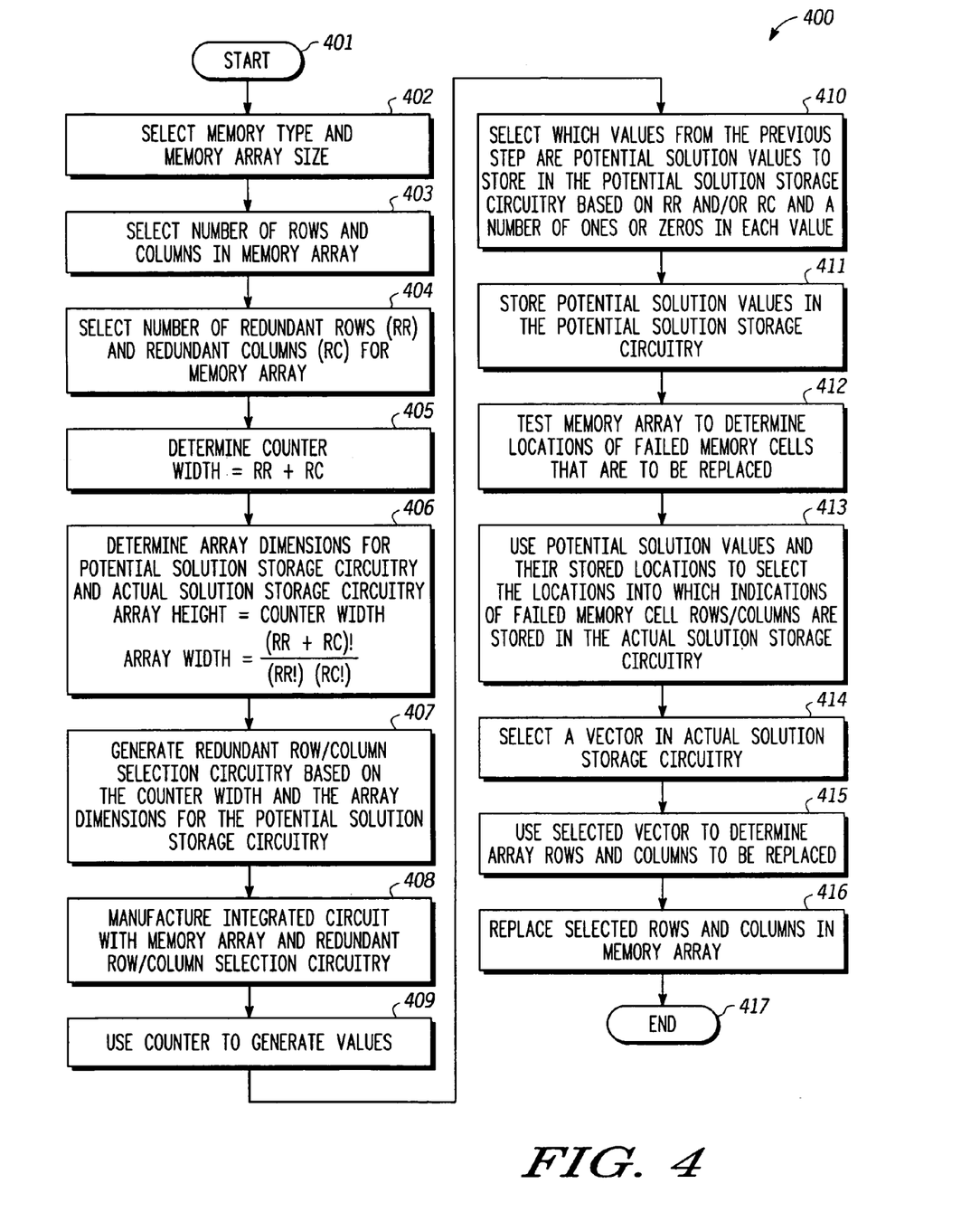
FIG. 4 illustrates, in flow diagram form, a method which can be used to determine which rows/columns in an integrated circuit memory should be replaced and to perform the replacement in accordance with one embodiment of the present invention.

FIG. 4 illustrates, in flow diagram form, a method 400 which can be used to determine which rows/columns in an integrated circuit memory array 20 should be replaced and to perform the replacement in accordance with one embodiment of the present invention. Flow 400 begins at start oval 401, and the flow proceeds to block 402 where memory type and memory array size are selected for memory 20 (see FIG. 1). The flow then proceeds to block 403 where the desired number of rows and columns in memory array 20 are selected. The flow then proceeds to block 404 where the number of redundant rows (RR) and the number of redundant columns (RC) are selected. The flow then proceeds to block 405 where the width of counter 54 (see FIG. 2) is determined to be equal to RR+RC. The flow then proceeds to block 406 where array dimensions for potential solution storage circuitry 50 and actual solution storage circuitry 92 (see FIG. 2) are determined using the equations: (1) ARRAY HEIGHT=RR+RC, which in one embodiment is the same as the counter 54 width; and (2) ARRAY WIDTH=(RR+RC)!/[(RR!)(RC!)]. Note that the symbol "!" represents the mathematical operation "factorial".

From step 406, the flow then proceeds to block 407 where redundant row/column selection circuitry 16 is generated based on the counter width and the array dimensions for potential solution storage circuitry 50. The flow then proceeds to block 408 where integrated circuit 10 can be manufactured with memory 20 and redundant row/column selection circuitry 16. The flow then proceeds to block 409 where counter 54 is used to generate values. The flow then proceeds to block 410 where values from step 409 are selected as potential solution values to store in potential solution storage circuitry 50. For one embodiment, the selection in step 410 is based on RR and/or RC and the number of ones or zeros in each value from step 409. The flow then proceeds to block 411 where potential solution values are stored in potential solution storage circuitry 50. The flow then proceeds to block 412 where memory array 20 is tested to determine if there are one or more locations of failed memory cells in array 20 that are to be replaced, and the locations of any failures.

The flow then proceeds to block 413 where the potential solution values and their stored locations are used to select the locations into which indications of failed memory cells rows/columns are stored in actual solution storage circuitry 92. The flow then proceeds to block 414 where a vector in actual solution storage circuitry 92 is selected. The flow then proceeds to block 415 where the selected vector from step 414 is used to determine array rows and columns to be replaced. The flow then proceeds to block 416 where selected rows and columns in memory array 20 are replaced. The flow then proceeds to end oval 417 where the flow ends for the illustrated embodiment. Alternate embodiments may have more, fewer, and/or different steps than those illustrated in FIG. 4. The flow 400 illustrated in FIG. 4 is intended as one possible example.

Figure 5:
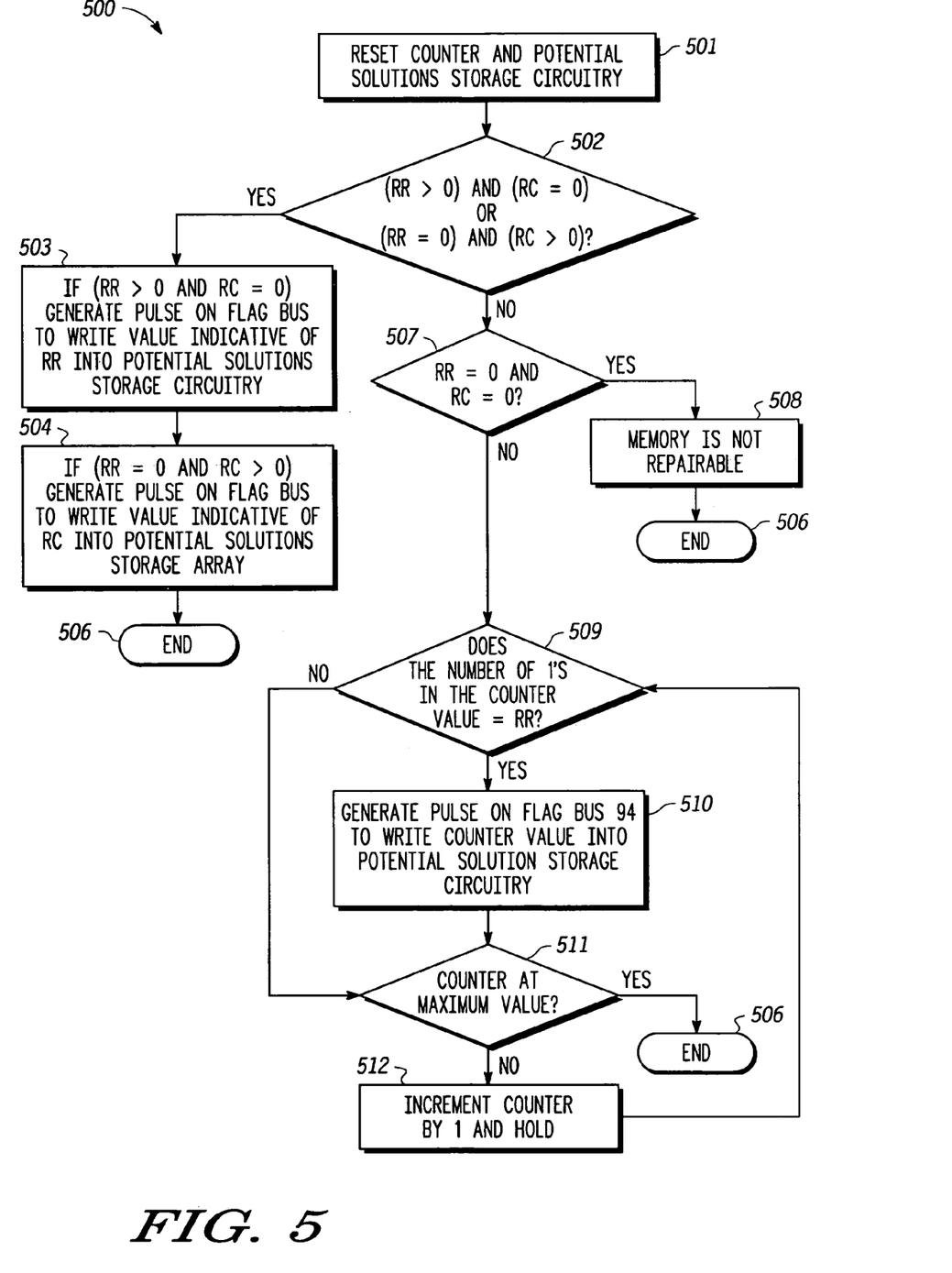
FIG. 5 illustrates, in flow diagram form, a method for performing steps 409–411 of FIG. 4 in accordance with one embodiment of the present invention.

FIG. 5 illustrates, in flow diagram form, a method 500 for performing steps 409–411 of FIG. 4 in accordance with one embodiment of the present invention. Flow 500 begins at block 501 where counter 54 and potential solutions storage circuitry 50 are reset (see FIG. 2). The flow then proceeds to decision diamond 502 where the question is asked "is [(RR>0) and (RC=0)] OR is [(RR=0) and (RC>0)]?". If the answer at decision diamond 502 is yes, then the flow proceeds to block 503 where if (RR>0 and RC=0), a pulse is generated on flag bus 94 to write a value indicative of RR into potential solution storage circuitry 50. The flow proceeds from block 503 to block 504 where if (RR=0 and RC>0), a pulse is generated on flag bus 94 to write a value indicative of RC into potential solution storage circuitry 50. From block 504, then flow proceeds to end oval 506 where the flow ends for the illustrated embodiment.

If the answer at decision diamond 502 is no, then the flow proceeds to decision diamond 507 where the question is asked "is (RR=0) and (RC=0)?". If the answer at decision diamond 507 is yes, then the flow proceeds to block 508 where a determination is made that memory 20 is not repairable because there are no available redundant rows 22, 24 or columns 26. From block 508, the flow then proceeds to end oval 506 where the flow ends for the illustrated embodiment. If the answer at decision diamond 507 is no, then the flow proceeds to decision diamond 509 where the question is asked "does the number of 1's in the counter value (from counter 54) equal RR?".

If the answer at decision diamond 509 is yes, then the flow proceeds to block 510 where a pulse is generated on flag bus 94 to write the counter 54 value into potential solution storage circuitry 50. From step 510, the flow then proceeds to decision diamond 511. If the answer at decision diamond 509 is no, then the flow proceeds to decision diamond 511 where the question is asked "is the counter 54 at its maximum value?". If the answer at decision diamond 511 is yes, then the flow proceeds to end oval 506 where the flow ends for the illustrated embodiment. If the answer at decision diamond 511 is no, then the flow proceeds to block 512 where counter 54 is incremented by 1 and is held or remains at this new value. From step 512, the flow then proceeds to decision diamond 509 again.

Note that steps 509–512 form a loop that is exited when the maximum value of counter 54 is reached. Note that alternate embodiments may count down instead of up. Also, alternate embodiments may count by increments other than 1, provided that all potential solution values are generated by counter 54 or are provided in some other way. Note that for an alternate embodiment that uses an encoder or other circuitry in place of or in addition to counter 54, the flow 500 illustrated in FIG. 5 may be very different.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method of replacing memory cells in a memory, the method comprising:
   generating a first; plurality of values;
   selecting a second plurality of values from the first plurality of values, the second plurality of values representing potential solutions for memory row/column replacement;
   determining locations of failed memory cells within a memory array;
   using the second plurality of values to store in a first storage circuit, row/column indications of the location of the determined failed memory cells, wherein the memory array is implemented in an integrated circuit, the integrated circuit includes at least one redundant row of a first number (RR) and at least one redundant column of a second number (RC), wherein the selecting of the second plurality of values from the first plurality of values further includes determined whether each value of the first plurality of values includes one of a number of logical 1's or a number of logical 0's equal to one of RR or RC.

2. The method of claim 1 wherein the generating of the first plurality of values is performed by circuitry of the integrated circuit.

3. The method of claim 1 wherein the selecting is performed by circuitry of the integrated circuit.

4. The method of claim 1 further comprising:
   storing the second plurality of values in a second storage circuit.

5. The method of claim 4 wherein a number of values of the second plurality of values stored in the second storage circuit is given by (RR+RC)!/(RR!*RC!).

6. The method of claim 5 wherein the indications are stored in the first storage circuit in a configuration having a first dimension given by (RR+RC)!/(RR!*RC!).

7. The method of claim 5 wherein each value of the second plurality stored in the second storage circuit has a number of bits given by (RC+RR).

8. The method of claim 7 wherein the indications are stored in the first storage circuit in a configuration having a second dimension given by (RC+RR).

9. The method of claim 4 wherein the using of the second plurality of values to store in a the first storage circuit, row/column indications of the location of the determined failed memory cells further includes storing one of a row address or a column address of a failed memory cell at a given location in the first storage circuit depending upon whether a bit of a value of the second plurality corresponding to the given location indicates a row or a column.

10. The method of claim 1 wherein the generating of a first plurality of values further includes operating a counter to provide die first plurality of values.

11. The method of claim 1 wherein die using of the second plurality of values to store in the first storage circuit, row/column indications of the location of the determined failed memory cells further includes using the second plurality of values to determine whether row information or column information of a failed memory cell is stored in the first storage circuit.

12. The method of claim 1 wherein the using of the second plurality of values to store in the first storage circuit, row/column indications of the location of the determined failed memory cells further includes using the second plurality of values to determine whether row information or column information of a failed memory cell is stored within a given location in the first storage circuit.

13. The method of claim 1 further comprising:
   if a failed memory cell is determined, using the indications to determine at least one row of a memory array to be replaced by at least one redundant row and/or at least one column of the memory array to be replaced by at least one redundant column.

14. The method of claim 1 further comprising:
   if a failed memory cell is determined, replacing at least one row and/or at least one column of the memory array with at least one redundant row and/or at least one redundant column as per a vector selected from the first storage circuit.

15. The method of claim 1 further comprising: manufacturing the integrated circuit.

16. An integrated circuit comprising:
   a memory array;
   at least one redundant row of a first number (RR) for the memory array;
   at least one redundant column of a second number (RC) for the memory array;
   a value generation circuit, the value generation circuit including an output to provide a plurality of values;
   a selection circuit, the selection circuit including an output to provide selected values of the plurality of values, wherein the selected values represent potential solutions for memory row/column replacement;
   a first storage circuit for storing the selected values,
   wherein the selection circuitry determines whether a value of the plurality has one of a number of logical 1's or a number of logical 0's equal to one of RR or RC.

17. The integrated circuit of claim 16 wherein the value generation circuit includes a counter.

18. The integrated circuit of claim 16 wherein each of the selected values stored in the first storage circuit has a number of bits given by RC+RR.

19. The integrated circuit of claim 16 wherein a number of selected values stored in the first storage circuit is given by (RR+RC)!/(RR!*RC!).

20. The integrated circuit of claim 19 wherein each of the selected values stored in the first storage circuit has a number of bits given by RC+RR.

21. The integrated circuit of claim 16 further comprising:
   a second storage circuit, the second storage circuit for storing indications of rows and columns of memory cell failures of the memory array.

22. The integrated circuit of claim 21 wherein the indications are stored in the second storage circuit in a configuration having a first dimension given by (RR+RC)!/(RR!*RC!).

23. The integrated circuit of claim 22 wherein the indications are stored in the second storage circuit in a configuration having a second dimension given by (RC+RR).

24. The integrated circuit of claim 21 further comprising:
   circuitry, having an input coupled to the second storage circuit and an output, the output providing a vector in the second storage circuit;
   replacement circuitry, the replacement circuitry for replacing at least one row of the memory array and/or at least one column of the memory array with at least one redundant row and/or at least one redundant column.

25. An integrated circuit comprising;
   a memory array;
   at least one redundant row for the memory array;
   at least one redundant column for the memory array;
   means for generating a first plurality of values;
   means for selecting a second plurality of values from the first plurality of values, wherein the second plurality at values represent potential solutions for memory row/column replacement, wherein the at least one redundant row is of a first number (RR) and the at least one redundant column is of a second number (RC), wherein a number of values of the second plurality selected is given by (RR+RC)!/(RR!*RC!).

26. The integrated circuit of claim 25 further comprising:
   means far using the second plurality of values to store in a storage circuit, row/column indications of Failed memory cells.

27. The integrated circuit of claim 26 wherein the means for using further includes:
   means for storing one of a row address or a column address of a failed memory cell at a given location in the storage circuit depending upon whether a bit of a value of the second plurality corresponding to the given location indicates a row or a column.

28. The integrated circuit of claim 26 wherein the means for using further includes:
   means for using the second plurality of values to determine whether row information or column information of a failed memory cell is stored in the storage circuit.

29. The integrated circuit of claim 26 wherein the means for using further includes:
   means for using the second plurality of values to determine whether row information or column information of a failed memory cell is stored within a given location in the storage circuit.

30. The integrated circuit of claim 25 farther comprising:
   a first storage circuit for storing the second plurality of values.

31. The integrated circuit of claim 25 wherein the means for selecting further includes means for determining whether each value of the first plurality of values includes one of a number of logical 1's or a number of logical 0's equal to one of RR or RC.

* * * * *

UNITED STATES PATENT AND TRADEMARK OFFICE
CERTIFICATE OF CORRECTION

| | |
|---|---|
| PATENT NO. | : 7,200,056 B2 |
| APPLICATION NO. | : 10/889159 |
| DATED | : July 12, 2004 |
| INVENTOR(S) | : Paul M. Gelencser et al. |

It is certified that error appears in the above-identified patent and that said Letters Patent is hereby corrected as shown below:

Column 12, Line 38, Claim No. 1:

Change "a first; plurality" to --a first plurality--

Column 13, Line 8, Claim No. 9:

Change "store in a the first" to --store in the first--

Column 13, Line 17, Claim No. 10:

Change "die" to --the--

Column 13, Line 18, Claim No. 11:

Change "die" to --the--

Column 14, Line 38, Claim No. 26:

Change "far" to --for--

Column 14, Line 39, Claim No. 26:

Change "Failed" to --failed--

Signed and Sealed this

Twentieth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 7,200,056 B2 Page 1 of 1
APPLICATION NO. : 10/889159
DATED : April 3, 2007
INVENTOR(S) : Paul M. Gelencser et al.

It is certified that error appears in the above-identified patent and that said Letters Patent is hereby corrected as shown below:

Column 12, Line 38, Claim No. 1:

Change "a first; plurality" to --a first plurality--

Column 13, Line 8, Claim No. 9:

Change "store in a the first" to --store in the first--

Column 13, Line 17, Claim No. 10:

Change "die" to --the--

Column 13, Line 18, Claim No. 11:

Change "die" to --the--

Column 14, Line 38, Claim No. 26:

Change "far" to --for--

Column 14, Line 39, Claim No. 26:

Change "Failed" to --failed--

This certificate supersedes the Certificate of Correction issued May 20, 2008.

Signed and Sealed this

Seventeenth Day of June, 2008

JON W. DUDAS
*Director of the United States Patent and Trademark Office*